United States Patent [19]

Nishizawa

[11] Patent Number: 4,641,167
[45] Date of Patent: Feb. 3, 1987

[54] SEMICONDUCTOR OPTOELECTRO TRANSDUCER

[75] Inventor: Jun-chi Nishizawa, Sendai, Japan

[73] Assignee: Semiconductor Research Foundation, Japan

[21] Appl. No.: 522,153

[22] PCT Filed: Nov. 30, 1982

[86] PCT No.: PCT/JP82/00458
§ 371 Date: Jul. 29, 1983
§ 102(e) Date: Jul. 29, 1983

[87] PCT Pub. No.: WO83/02038
PCT Pub. Date: Jun. 9, 1983

[30] Foreign Application Priority Data

Dec. 1, 1981 [JP] Japan .................... 56-194286

[51] Int. Cl.$^4$ ............... H01L 27/14; H01L 31/00
[52] U.S. Cl. ............................................. 357/30
[58] Field of Search .................. 357/30, 32, 45, 58

[56] References Cited

U.S. PATENT DOCUMENTS 4,497,109  2/1985  Huber et al. .................... 357/30

Primary Examiner—William L. Sikes
Assistant Examiner—Robert E. Wise
Attorney, Agent, or Firm—McGlew and Tuttle

[57] ABSTRACT

A semiconductor optoelectro transducer is highly sensitive in infrared to far infrared regions and is operable at high speed. To this end, the optoelectro transducer is formed by a static induction transistor or a static induction thyristor and an element which are excited by light of longer wavelength than that of light corresponding to the energy of the energy gap of a channel region, is added to the channel region which receives light.

9 Claims, 39 Drawing Figures

SEMICONDUCTOR OPTOELECTRO TRANSDUCER

TECHNICAL FIELD

The present invention relates to a high-sensitivity, high-speed semiconductor optoelectro transducer which presents its features particularly in infrared to far infrared regions.

TECHNICAL BACKGROUND

Heretofore, there have been proposed infrared ray and far infrared ray detectors employing a thermocouple and a photoconductive cell but they have the defects of poor sensitivity and low operating speed.

SUMMARY OF THE INVENTION

The present invention is intended to obviate such defects of the prior art and has for its object to provide a semiconductor optoelectro transducer which is highly sensitive and operable at high speed in infrared to far infrared regions.

The semiconductor optoelectro transducer of the present invention includes a channel region of a low impurity density semiconductor of one conductivity type or intrinsic semiconductor, two main electrodes provided in contact with the channel for flowing a main current and gate regions provided in the channel region in a manner not to close a main current path; an element, which is excited by light of longer wavelength than that of light corresponding to the energy of the energy gap of the channel region to form an impurity level, is added to the semiconductor of the channel region to permit a portion of the channel region to receive light; and a depletion layer near the gates in the channel region is controlled by the quantity of light incident on the channel, the two electrodes and voltage applied to at least one of the gates.

The semiconductor optoelectro transducer of the present invention possesses the following advantages that are unobtainable with conventional bipolar transistors and photo transistors. That is, (1) The device of the present invention is high in sensitivity.

(2) The device of the present invention is small in gate resistance and high in operating speed since the gate region is a p+ (or n+) layer of high impurity density. Further, by an external gate resistor $R_G$ connected to the gate, the operating speed can be adjusted.

(3) The device of the present invention has low noise and is operable not only at room temperature but also at low temperature. The device of the present invention is a semiconductor optoelectro transducer infrared and far infrared rays for which is a three-terminal device of high speed and high sensitivity, and hence it is of great inductrial value.

PREFERRED EMBODIMENTS OF THE INVENTION

Figure 1A:
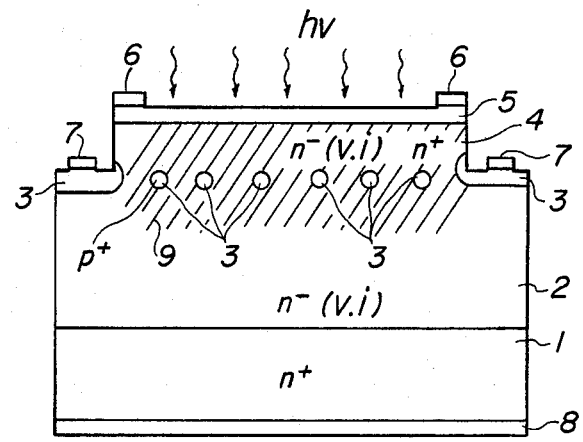
FIG. 1(a) is a sectional view of a photo detector of the present invention.
Figure 1B:
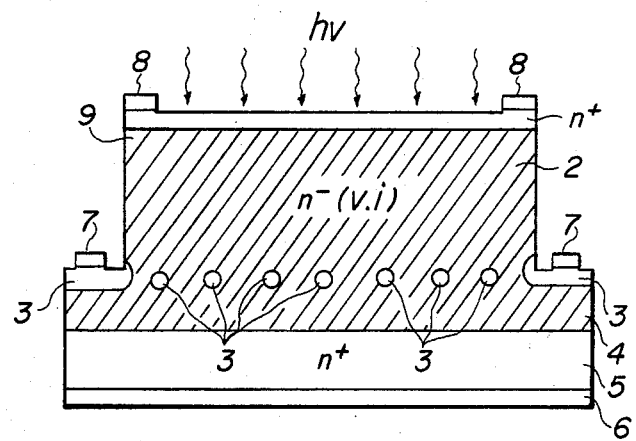
FIG. 1(B) is a sectional view of another embodiment for a photo detector.

FIGS. 1(A) and 1(B) are sectional views of a semiconductor device for use in the semicondutor optoelectro transducer of the present invention.

Reference numeral 1 indicates an n+ substrate of silicon, 2 an n-type high resistivity layer (which may also be a ν layer or i layer of an intrinsic semiconductor) and 3 a high impurity density p+ layer of a p-type semiconductor which will ultimately form the gate and which is so formed as not to close a main current path (hereinafter referred to as the channel) established by the n-type high resistivity layer 2. The p+ layer 3 may be in the form of a mesh, linear or some other desired form. Reference numeral 4 indicates an n-type high resistivity layer, the impurity density of which may be the same as that of the high resistivity layer 2 on the opposite side of layer 3. Reference numeral 5 denotes a high impurity density n+ layer of an n-type semiconductor, 6 a source electrode, 7 a gate electrode and 8 a drain electrode. The channel region between layers 2 and 4 is shown by hatching. Gate layer 3 is disposed in this region.

The source electrode 6 is formed in a manner not to cover the entire area of the surface of the source so that infrared or far infrared rays hν may be applied to the channel.

Those regions of the layer 2 and 4 which will form the channel are doped with an impurity atom which is excited by infrared or far infrared light. The hatched region 9 indicates that region. The region to be doped with the impurity element which is excited by the infrared or far infrared light is selected in accordance with the region of wavelength of light to be detected, and the thickness of the region to be doped may be about the penetration depth of the infrared or far infrared light. Such an impurity element may preferably be gold, mercury, zinc or the like in the case of a germanium substrate and gold or the like in the case of a silicon substrate.

The present invention is characterized in that the channel is doped with the impurity element which is excited by the infrared or far infrared light.

In the semiconductor device of FIG. 1(A), for example, the high resistivity layers 2 and 4 are formed by epitaxial growth and the p+ gate region is formed by selective diffusion or selective ion implantation. The region 9 is formed, after the formation of the n+ region 5 by diffusion, by depositing an appropriate element through vacuum evaporation or DC sputtering and diffusing it through heat treatment to a desired depth. The electrodes 6, 7 and 8 are formed by vacuum evaporated aluminum and then selectively etching it away. For protecting the semiconductor device of FIG. 1(A), a protective film may be deposited thereon to such a thickness that does not constitute an obstacle to the irradiation by the infrared or far infrared light. Further, the source electrode may also be a transparent one instead of the metal electrode as of aluminum.

It is preferable that the impurity densities of the high resistivity layers 2 and 4 be lower than $10^{16}$ cm$^{-3}$, the impurity density of the p+ gate region 3 higher than $10^{18}$ cm$^{-3}$ and the impurity densities of the n+ regions 1 and 5 higher than $10^{18}$ cm$^{-3}$. This is the requirement for the static induction transistor. An increased impurity density of the channel provides an ordinary field effect transistor.

The present invention may preferably used with the static induction transistor but is effective for an ordinary field effect transistor, too.

FIG. 1(B) illustrates another embodiment of the semiconductor optoelectro transducer of the present invention similar to the embodiment shown in FIG. 1(A), which has a buried gate structure.

In the figure, 2 is a high resistivity n− layer (which may also be a ν layer or i layer of an intrinsic semiconductor), 3 is a high impurity density p+ layer of such a shape as not to close the channel, which is a region of stripe- or mesh-patterned structure, and 4 is a length with the same high resistivity n− character as the n− layer 2. The channel formed by the n− layers 2 and 4 is added with an impurity element that is excited by the infrared or far infrared light hν. The hatched portion 9 is that region, which need not always be formed over the entire areas of the n− layers 2 and 4. Reference numerals 1 and 5 indicate high impurity density n+ layers which are to form the drain and the source, respectively. Reference numerals 8, 6 and 7 denote a drain electrode, a source electrode and a gate region. The infrared or far infrared light is applied from the side of the drain as illustrated in FIG. 1(B).

Figure 2A:
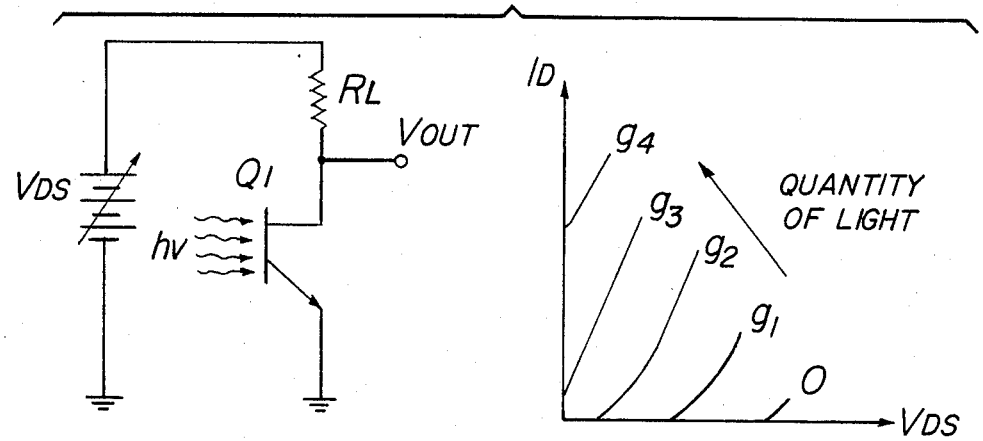
FIG. 2(A) is an explanatory diagram of the operation of the semiconductor optoelectro transducer of the present invention and showing its circuit and current-voltage characteristics obtained when it is irradiated by infrared or far infrared rays.

FIGS. 2(A), (B) and (C) are diagrams that are explanatory of the operation of the semiconductor optoelectro transducer of the present invention.

FIG. 2(A) shows the case of a floating gate with no bias thereon, connected between the gate and the source.

$Q_1$ is the semiconductor optoelectro transducer of the present invention, $V_{DS}$ is a drain-source voltage source and $R_L$ is a load resistor. The semiconductor optoelectro transducer is irradiated by the infrared or far infrared light hν. Its I-V characteristic is such that when the quantity of light is zero, no current flows and when the quantity of light increases to $g_1$, $g_2$, $g_3$ and $g_4$, a drain current flows to produce across the load resistor an output voltage $V_{out}$ corresponding to the light. This operation stems from the fact that electron-hole pairs are created by the infrared or far infrared light and holes are absorbed by the p+ gate region to charge it positive to yield a forward voltage between the gate and the source, causing a source-to-drain current flow.

Figure 2B:
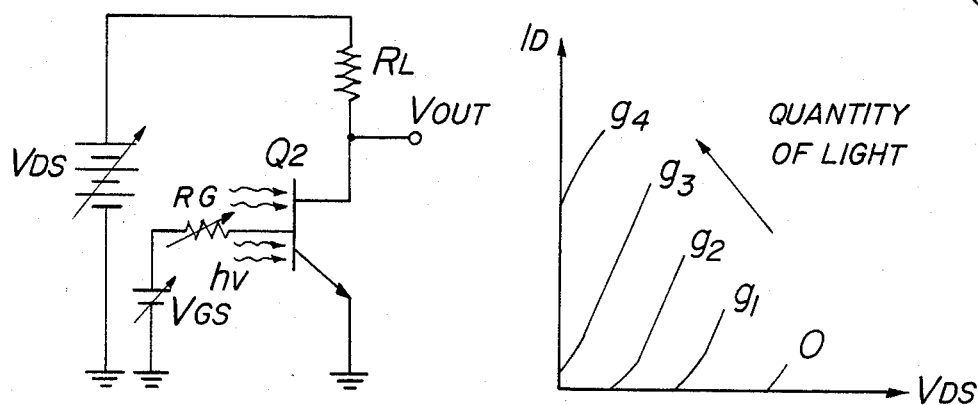
FIGS. 2(B) and (C) are each similar to FIG. 2(A), and show other embodiments of the invention.
Figure 2C:
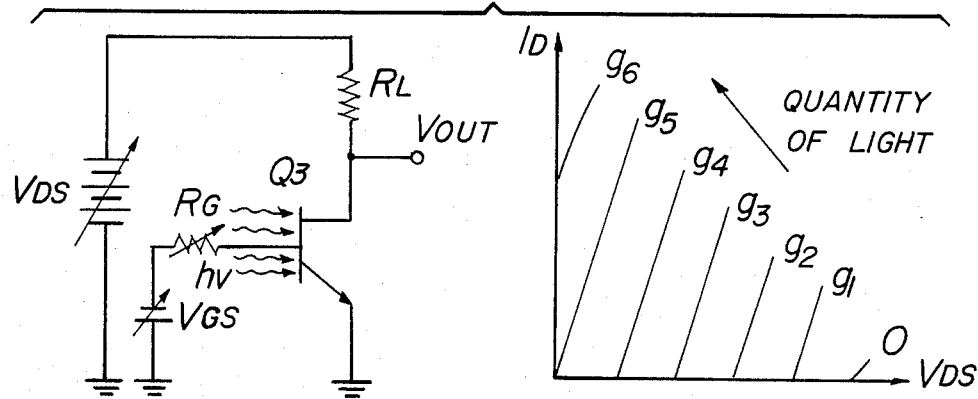

FIGS. 2(B) and 2(C) are diagrams explanatory of the operation of the semiconductor optoelectro transducer of the present invention in the cases where a forward voltage source and a reverse voltage source are connected via a gate resistor $R_G$ between the gate and the source, respectively.

$V_{GS}$ is a voltage source between the gate and the source, and $R_G$ is a gate resistor, which is provided for selecting a desired resistance value.

In the case where the gate-source voltage is forward, the electron-hole pairs excited by the infrared or far infrared light hν applied to the channel near the gate flow from the gate to the source, by which the potential at the intrinsic gate point where a potential barrier against the electrons is the highest in the channel is lowered, permitting an abrupt flow of electrons from the source region to the drain region. With an increase in the quantity of light from zero to $g_1$ to $g_4$, the drain current increases, performing amplification of the infrared or far infrared light. At this time, by changing the value of the gate resistor $R_G$, the sensitivity can be adjusted.

FIG. 2(C) illustrates the semiconductor optoelectro transducer of the present invention for infrared or far infrared light in which the gate-cathode potential is set in the reverse direction.

With the gate bias increased to prevent the drain current flow, holes of the electron-hole pairs created by the irradiation of the infrared or far infrared light hν in the channel are immediately attracted to the gate electrode to cause gate current flow and a voltage drop developed by the gate current across the gate resistor $R_G$ causes gate-source voltage to go positive, by which the drain current abruptly increases, amplifying the infrared or far infrared light. The illustrated I-V characteristic shows how the drain current increases when the quantity of light increases from zero to $g_1$ to $g_6$. It is also possible to vary the photo sensitivity characteristic by changing the drain voltage to $V_{D1}$, and $V_{D2}$ and $V_{D3}$.

In the static induction transistor, a depletion layer is formed to extend from the gate to the channel and, depending on the manner of forming the depletion layer, the normally OFF type and the normally ON type I-V characteristics can be obtained. By controlling the gate spacing, the gate thickness and the impurity density of the channel, a desired I-V characteristic can be obtained. The operating characteristics of FIGS. 2(A) through 2(C) can be selected according to the purpose of use of the semiconductor optoelectro transducer of the present invention for infrared or far infrared light.

While in respect of FIGS. 2(A) to 2(C) the semiconductor optoelectro transducers $Q_1$ to $Q_3$ are described to be n-channel, it is a matter of course that a similar semiconductor optoelecro transducer can be obtained with a p-channel device, too.

Figure 3A:
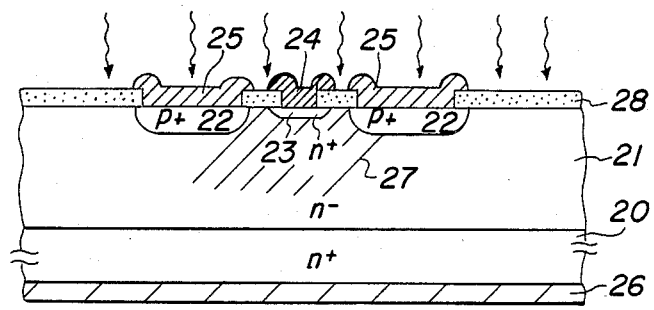
FIG. 3(A) is a sectional view of another embodiment of the present invention.
Figure 3B:
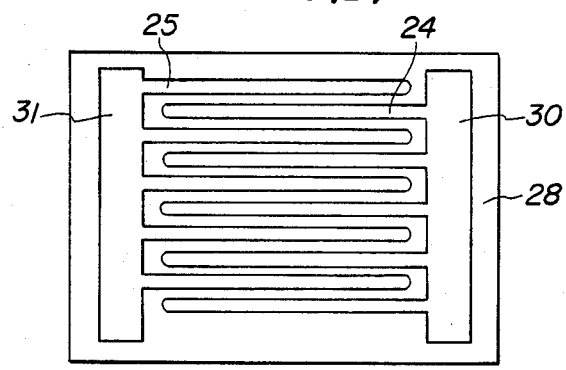
FIG. 3(B) is a top plan view of a further embodiment of the invention which is similar to that of FIG. 3(A)

FIGS. 3(A) and 3(B) illustrate another embodiment.

This is an infrared or far infrared semiconductor optoelectro transducer of a planar gate structure in which the gate is provided in the same plane as the source so as to reduce stray capacitance between the gate and the source. Reference numeral 20 indicates an $n^+$ substrate which forms the drain, 21 a high resistivity $n^-$ layer (which may also be a $\nu$ layer or intrinsic semiconductor i layer), 23 a high impurity density $n^+$ layer which will serve as the source, 22 a high impurity density $p^+$ gate region of a linear or mesh structure so that it may not close the channel of the $n^-$ layer 21, and 24, 25 and 26 are source, gate and drain electrodes. Reference numeral 27 denotes a region added with an impurity element which is excited by infrared or far infrared light $h\nu$, and this is formed in the region to which the infrared or far infrared light $h\nu$ is applied.

FIG. 3(B) is a top plan view of FIG. 3(A), and the gate and source electrodes have inter-digitate stripe patterns. Reference numeral 30 indicates a bonding region (pad) of the source electrode 24 and 31 a bonding region (pad) of the gate electrode 25.

Figure 4:
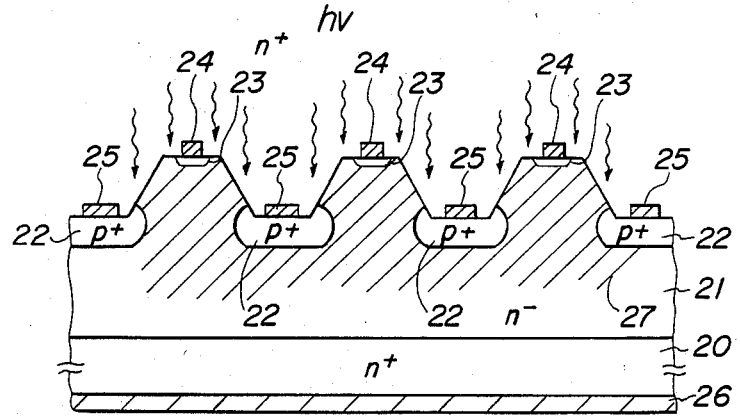
FIG. 4 is a sectional view of a further embodiment of the invention.

FIG. 4 illustrates another embodiment of the present invention.

This embodiment has the recessed gate structure that the gate electrode 25 and the $p^+$ gate region 22 are formed below the source for increasing the light receiving area of the channel which is exposed to irradiation by infrared or far infrared light. The recessed gate structure can easily be formed by chemical etching, plasma etching or like method.

With such a structure, the stray capacitance between the gate 22 and the source 23 is smaller than in the embodiments of FIGS. 1 and 3.

Figure 5:
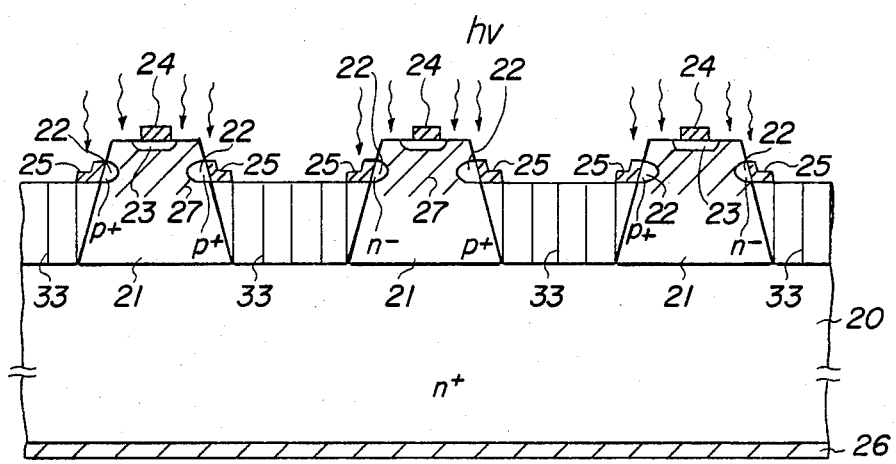
FIG. 5 is a sectional view of a still further embodiment of the invention.

FIG. 5 illustrates another embodiment of the present invention, in which the stray capacitance between the gate and the drain is further reduced than in the semiconductor device of FIG. 4 and in which the recess is formed to extend down to the drain region 20 and filled with an insulator 33 and the gate electrode 25 is provided on the top surface of the insulator 33.

With the structure of this embodiment, the stray capacitances between the gate and the source and between the gate and the drain are small and the infrared or far infrared light receiving area of the channel increases, so that a higher-speed, high-sensitivity semiconductor optoelectro transducer for infrared or far infrared light can be obtained.

Since the static induction thyristor permits the high-speed ON-OFF operation by gate voltage that is impossible with a conventional p-n-p-n thyristor, it can be used in the semiconductor optoelectro transducer of the present invention.

FIGS. 6(A) through 6(D) illustrate embodiments which employ the static induction thyristor (hereinafter referred to as SI thyristor) as the semiconductor device of the semiconductor optoelectro transducer.

Figure 6A:
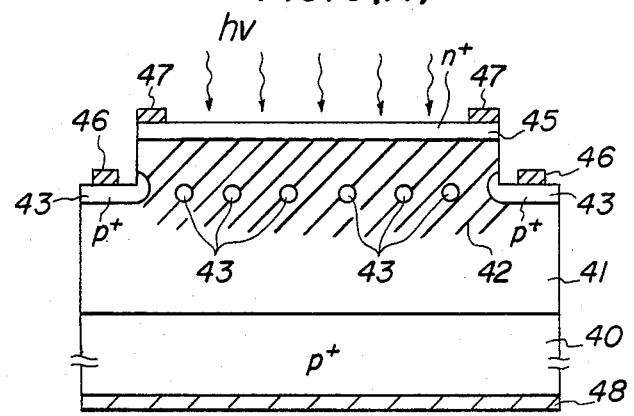
FIGS. 6(A), 6(B), 6(C) and 6(D) are sectional views of static induction thyristors included in the photo detector of the present invention.

FIG. 6(A) shows an SI thyristor of the buried gate structure, in which the drain region 1 of the static induction transistor of FIG. 1(A) is replaced with a $p^+$ anode region 40.

Reference numeral 40 indicates a p-type high impurity density region which will form the anode region, 45 an n-type high impurity density region of the cathode, 41 a high resistivity $n^-$ layer or intrinsic semiconductor region which will form the channel, 42 a region provided in the channel which is added with an impurity element that is excited by the infrared or far infrared light $h\nu$, 48 an anode electrode, 46 a gate electrode, and 47 a cathode electrode. By changing the impurity density of the $p^+$ gate region, the width and thickness of the gate and the gate spacing, a static induction thyristor can be fabricated which has both normally ON and normally OFF anode current-voltage characteristics. A forward block voltage is dependent on the shape of the gate and the thickness and impurity density of the channel layer. During conduction, this thyristor operates as a $p^+$-$n^-$(i)-$n^+$ diode, it is desirable that the impurity densities of the anode and cathode regions be high for raising the injection efficiency. Since a decrease in the gate resistance increases the main current cut-off ability to raise the switching speed and to make it difficult to break over, it is preferable that the impurity density of the gate region be as high as possible. The impurity densities of the gate, anode and cathode regions are selected higher than about $1 \times 10^{18}$ cm$^{-3}$ and the impurity density of the channel lower than about $1 \times 10^{16}$ cm$^{-3}$. The forward block voltage is around 600 V when the channel is formed in a silicon high resistivity $n^-$ substrate having a thickness of approximately 300 $\mu$m.

It is also possible to employ a $p^+$ substrate as the anode region 40 and to form an $n^-$ layer by vapor epitaxial growth, or to form the gate and anode regions by diffusion of boron into a high resistivity $n^-$ substrate.

Figure 6B:
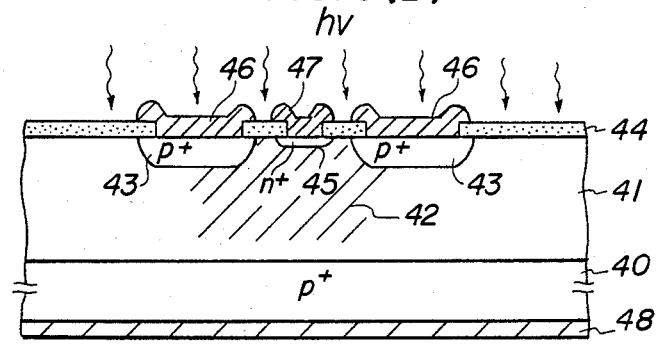
Figure 6C:
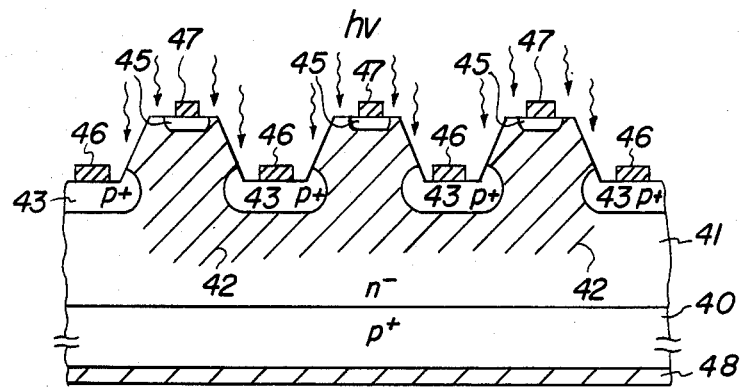
Figure 6D:
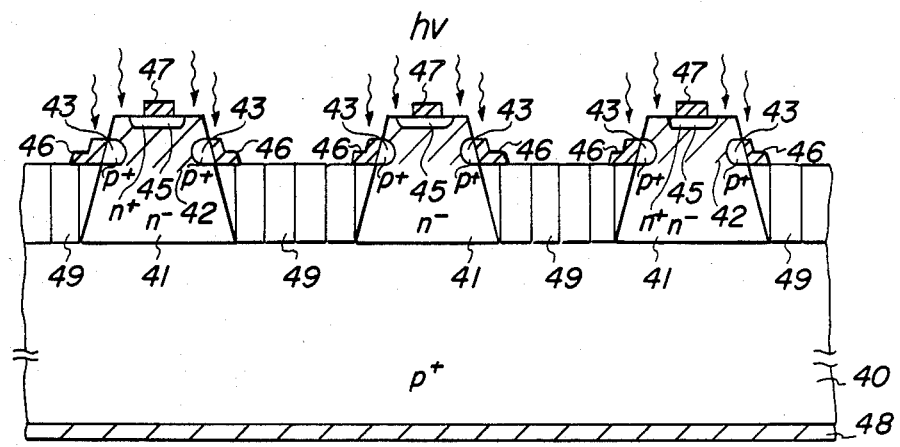

FIG. 6(B) illustrates a planar gate type static induction thyristor and FIGS. 6(C) and 6(D) recessed gate type static induction thyristors. The embodiments of FIGS. 6(B) to 6(D) have the advantage that the stray capacitances between the gate and the cathode and between the gate and anode are smaller than in the embodiment of FIG. 6(A) to provide for increased switching speed. In FIG. 6(D) reference numeral 49 indicates an insulator, for example, an SiO$_2$ or Si$_3$N$_4$ film, which is formed by the CVD method.

Figure 7:
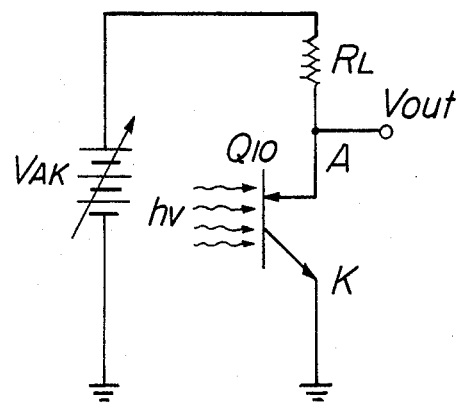
FIG. 7(A) is a circuit diagram for the embodiments of FIGS. 6(A) through 6(D)
FIG. 7(B) is a curve showing the current-voltage characteristics for the circuit in FIG. 7(A)
FIG. 7(C) is a circuit diagram which also shows the operation of the embodiments of FIGS. 6(A) through 6(D), connected in a different manner.
FIG. 7(D) is a curve showing the current-voltage characteristics for the circuit of FIG. 7(C)
Figure 7:
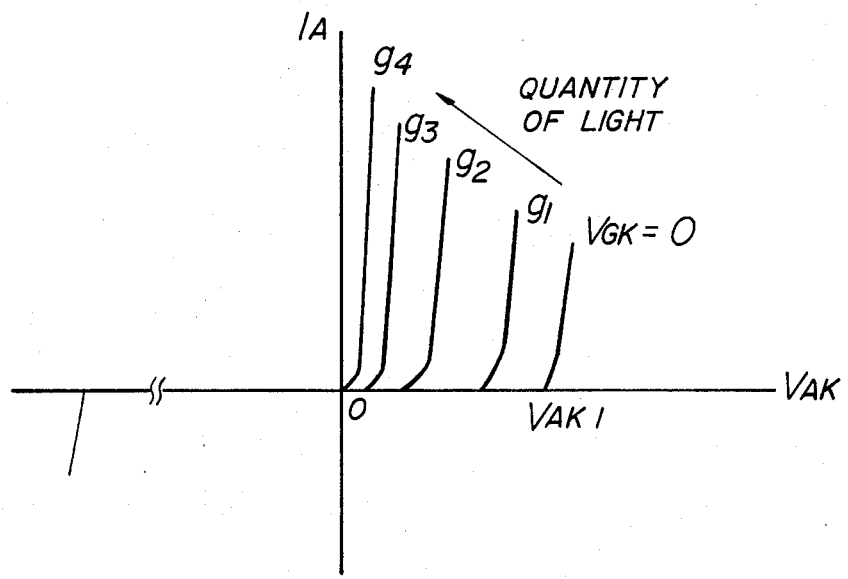
Figure 7:
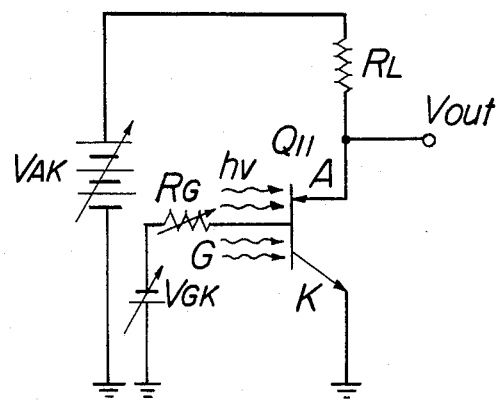
Figure 7:
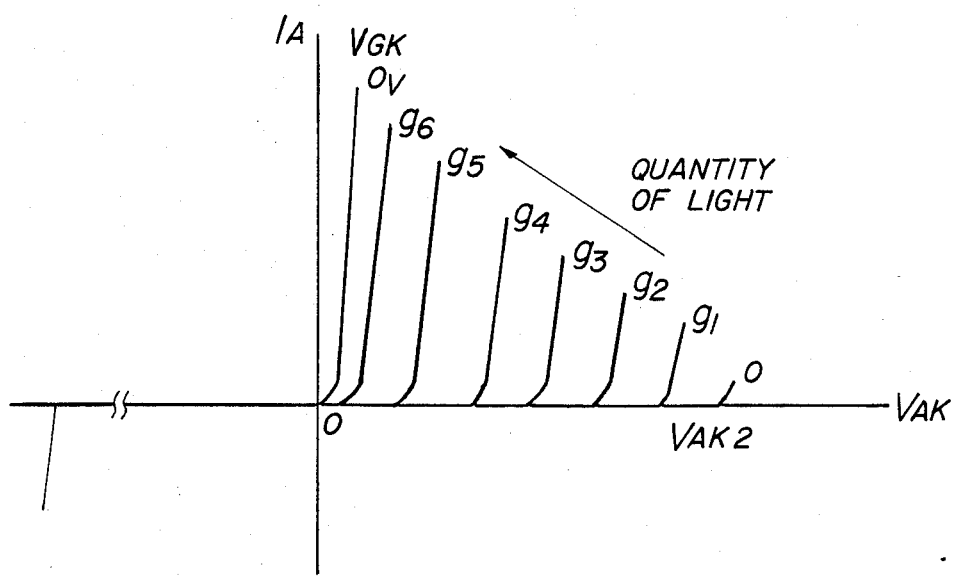

FIGS. 7(A) thorugh 7(D) are diagrams explanatory of the operation of the static induction thyristors shown in FIG. 6.

FIG. 7(A) shows the case where a normally OFF type static induction thyristor $Q_{10}$ is used, the gate is made floating and an anode-cathode voltage source $V_{AK}$ and a load resistor $R_L$ are connected. The thyristor $Q_{10}$ is irradiated by infrared or far infrared light having the energy $h\nu$ and an anode-to-cathode current flows to produce the output $V_{out}$, thus carrying out photoelectric conversion.

FIG. 7(B) shows the I-V characteristic of the embodiment of FIG. 7(A) during operation. When the quantity of light is increased to $g_1$ to $g_4$ in such a state in which $V_{AK}=V$ and the forward voltage is blocked up to $V_{AK1}$, anode current increases. When the irradiation by the infrared or far infrared light is stopped, the initial blocking state is restored.

FIG. 7(C) shows the I-V characteristic in case where a normally ON type static induction thyristor $Q_{11}$ is used and the gate-cathode potential is set in the reverse direction to block the anode voltage up to $V_{AK2}$ and the quantity of infrared or far infrared light is increased to $g_1$ to $g_6$. Voltage is made negative to retain the forward block voltage high. When infrared or far infrared light having the energy $h\nu$ is applied to the channel, the gate-to-cathode current flows to cause a voltage drop across the resistor $R_G$ to reduce the gate-cathode voltage, by which the anode-to-cathode current flows to provide the output $V_{out}$, thus performing the photoelectric convention. When the irradiation of infrared or far infrared light is stopped, the voltage drop across the resistor $R_G$ gradually diminishes to return to the initial reverse voltage, cutting off the main current.

Figure 8A:
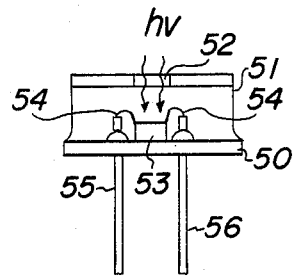
FIGS. 8(A) and 8(B) are diagrams showing examples in which the packaging case of the semiconductor optoelectro transducer is irradiated by infrared and far infrared rays.

FIG. 8(A) illustrates another embodiment of the present invention.

Figure 8B:
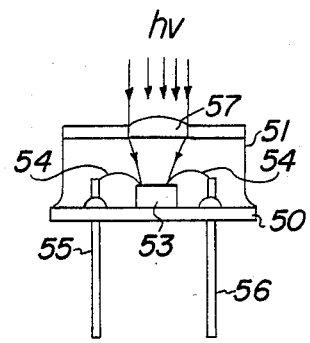

A semiconductor optoelectro transducer 53 of the present invention is incorporated in a packaging case comprising a cap 51 provided with a window 52 and a stem 50. Reference numeral 55 indicates a pin of the gate and 56 a pin of the source or cathode, and the stem 50 serves as the drain or anode. The pins 55 and 56 are insulated from the stem 50, and the gate electrode and the source or cathode electrode of the semiconductor optoelectro transducer are by gold or a aluminum lead wires 54 connected to the gate pin 55 and the source or cathode pin 56, respectively. The window is made of glass, quartz glass, transparent resin or sapphire and these materials are selectively used in accordance with the incident light used. The window may also be such a lens structure as shown in FIG. 8(B). Reference numeral 57 indicates the window of the lens structure, which acts to converge the infrared or far infrared light on the operating layer of the semiconductor optoelectro transducer of the present invention as illustrated.

The case need not always be such a metal-made one as mentioned above but may also be a resin-sealed one or the like employed for ordinary photo diodes and photo transistors if it has a window.

Figure 9A:
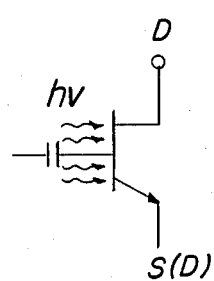
FIG. 9(A) is a circuit diagram showing an embodiment of the invention having a capacitor connected to the gate.
Figure 9B:
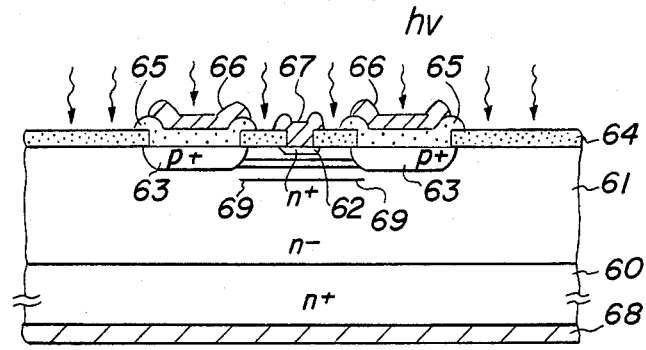
FIGS. 9(B), 9(C), 9(D) and 9(E) are sectional views showing embodiments of the invention illustrated by the circuit diagram of FIG. 9(A)
Figure 9C:
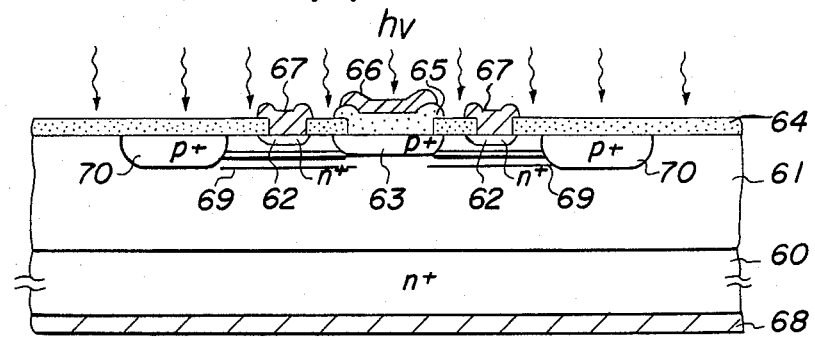
Figure 9:
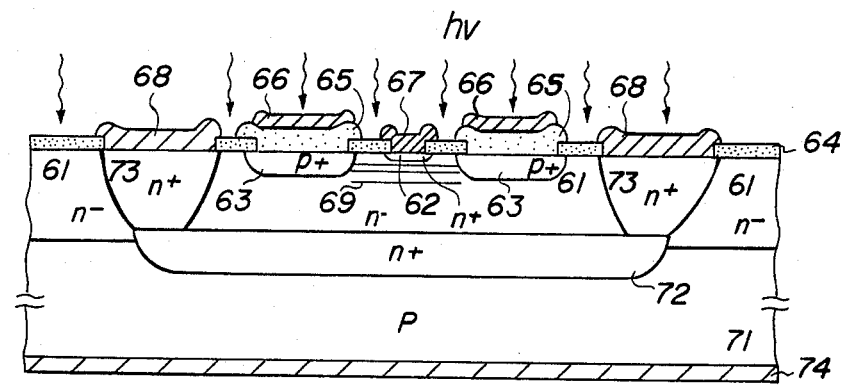
Figure 9:
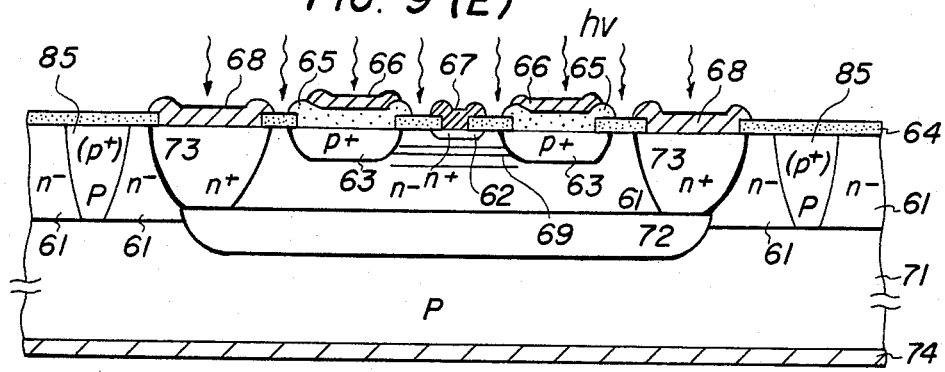

FIG. 9 illustrates other embodiments of the present invention. FIG. 9(A) is a diagram showing the principle in the case of using the semiconductor device of the present invention as an infrared or far infrared light storage cell, a capacitor being connected to the gate of the static induction transistor. As this semiconductor device can be used the semiconductor devices described previously in connection with FIGS. 1 to 8. Carriers created by the irradiation of infrared or far infrared light in the channel gather in the vicinity of the gate to charge up the electrostatic capacitor of the gate region, by which an infrared or far infrared light signal is stored. FIG. 9(B) illustrates its embodiment. An n⁻ (or intrinsic) layer 61 or high resistivity is formed by vapor epitaxial growth on an n⁺ substrate 60, for example, of silicon and, by selective diffusion through a silicon dioxide film, p⁺ gate regions 63 of high impurity density and high impurity density regions 62 which will ultimately form the source are formed. The n⁻ layer of the channel is partly or entirely formed by a region 69 added with the impurity element that is excited by the infrared or far infrared light. Reference numeral 65 indicates a material which forms a capacitor on the gate and which is dielectric, such as $SiO_2$, $Si_3N_4$ or the like, and 66 denotes metal electrodes as of aluminum. Reference numerals 67 and 68 indicate metal electrodes of the source and the drain, respectively. The metal electrodes 67 and 68 may also be formed as drain and source electrodes as shown in FIG. 9(A). Reference numeral 64 indicates a surface protective film of silicon dioxide.

FIG. 9(C) illustrates another embodiment which is provided with the gate 63 having connected thereto a capacitor and a gate 70 with no capacitor (hereinafter referred so as the floating gate). The gates 63 and 70 can be formed by the same diffusion step. The floating gate may also be metalwired for proper biasing, or made equipotential to the source. The above is the case in which the n⁺ substrate is used as the source or drain. Next, embodiments using a p substrate are shown in FIGS. 9(D) and (E). In FIG. 9(D), a drain region 72 is formed by diffusion of arsenic in a p substrate 71 doped with boron to a density of about $1 \times 10^{16}$ cm⁻³. On the drain region 72 is formed by vapor epitaxial growth the high resistivity n⁻ layer (which may also be an intrinsic semiconductor layer 61). In order to wire the buried drain region 72 on the wafer surface, an n⁺ layer 73 is formed by selective diffusion. Thereafter the gate and the source can be formed by the same steps as those in FIG. 9(B).

The drain, gate and source electrodes 68, 66 and 67 are formed by aluminum.

FIG. 9(E) shows an embodiment for isolating one cell of the embodiment of FIG. 9(D), in which the cell is isolated by diffusion. A p or p⁺ layer 85 is an isolation region. In the above embodiments, since one or the whole part of the n⁻ layer of the channel is formed as the region 62 added with the impurity elements which are excited by infrared or far infrared light, the infrared or far infrared light signal can be stored in the capacitor of the gate region. It is a matter of course that the source and drain can be made reverse from those described in the embodiments.

Figure 10A:
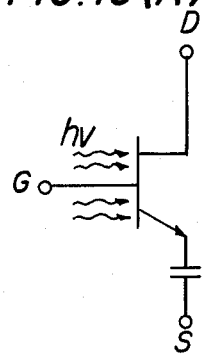
FIGS. 10(A) and 10(B) are circuit diagrams showing how a capacitor can be connected to the source of drain in accordance with the invention.

FIGS. 10(A) to 10(D) illustrate other embodiments of the present invention. FIG. 10(A) shows an example in which the capacitor for storing the infrared or far infrared light signal is connected to the source, and FIG. 10(B) an example in which the capacitor for storing the infrared or far infrared light signal is connected to the drain.

Reference numerals used in these embodiments correspond to those in FIG. 9. FIG. 10(C) shows an example in which the capacitor is connected to the n⁺ source region 62, reference numeral 75 indicating polysilicon, 76 an oxide film and 67 an aluminum electrode. The polysilican 75, the oxide film 76 and the aluminum electrode 67 constitute the capacitor. A metal electrode 66 is formed on the p⁺ layer of the gate.

Figure 10B:
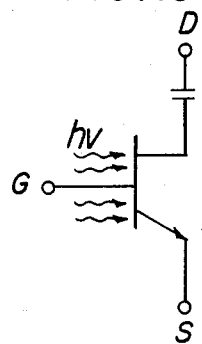
Figure 10C:
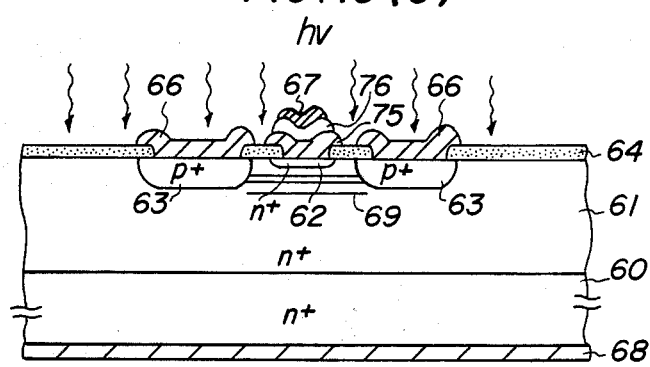
FIGS. 10(C) and 10(D) are sectional views of embodiments of the present invention in which a capacitor is connected to the drain or source.
Figure 10D:
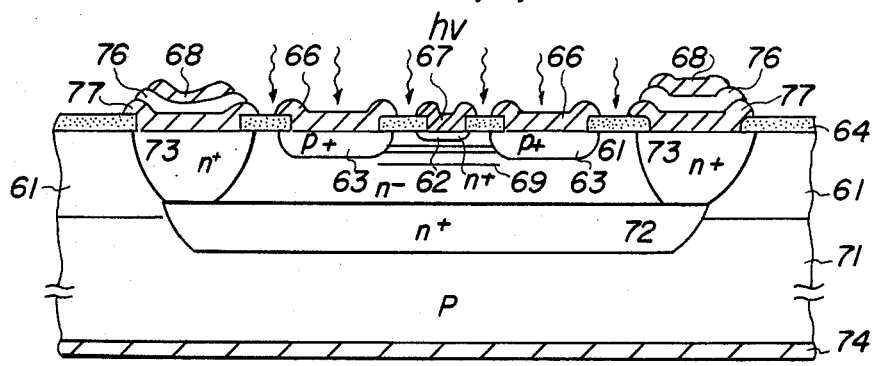

FIG. 10(D) shows an embodiment in which the capacitor connected to the drain, shown in FIG. 10(B), is provided on a p substrate. Reference numeral 77 indicates polysilicon, 76 an oxide film and 68 a drain electrode, by which the capacitor is constituted.

In FIGS. 10(C) and 10(D) the source and the drain may be reversed. The material forming the capacitor is not limited specifically to the silicon oxide film but may also be an $Si_3N_4$, $Al_2O_3$ or like film.

Another embodiment of the present invention is shown in FIGS. 11(A) to 11(D). FIG. 11(A) shows an example in which a capacitor and a resistor are connected in parallel to the gate of the static induction transistor, and FIG. 11(B) shows another example in which a capacitor and a resistor are similarly connected in series to the gate. The both example are intended for storing the infrared or far infrared light signal for the time determined by the time constant dependent on the values of the capacitor and the resistor. When the resistance value is large, the capacitor may also be omitted. Also it is possible that a capacitor having connected thereto a resistor in series or in parallel is connected to the source or drain.

FIG. 11(C) shows another embodiment in which a capacitor and a resistor are connected in parallel to the gate.

Reference numeral 77 indicates a resistor of, for example, boron-doped polysilicon, 78 a dielectric thin film as of silicon dioxide and 66 a metal electrode, by which the capacitor and the resistor are connected to the gate region 62.

FIG. 11(D) shows another embodiment of the present invention corresponding to FIG. 11(B). Reference numeral 80 indicates boron-doped polysilicon, which serves as a resistor, 81 a dielectric thin film as of silicon dioxide, and 66 a metal electrode. The polysilicon 80, the dielectric thin film 81 and the metal electrode 66 constitute a resistor and a capacitor which are connected in series to the gate region 62.

The resistor and the capacitor can be formed not only by the abovesaid members but may also by phosphorus-doped polycrystals, a p-n junction, and an $Si_3O_4$ or $Al_2O_3$ films.

Figure 12A:
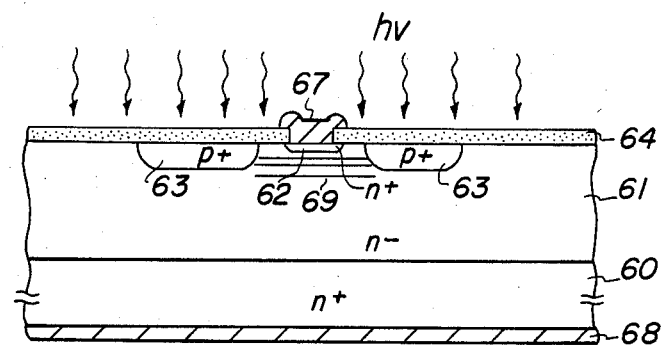
FIGS. 12(A) and 12(B) are sectional views of an example in which the gate is made floating.
Figure 12B:
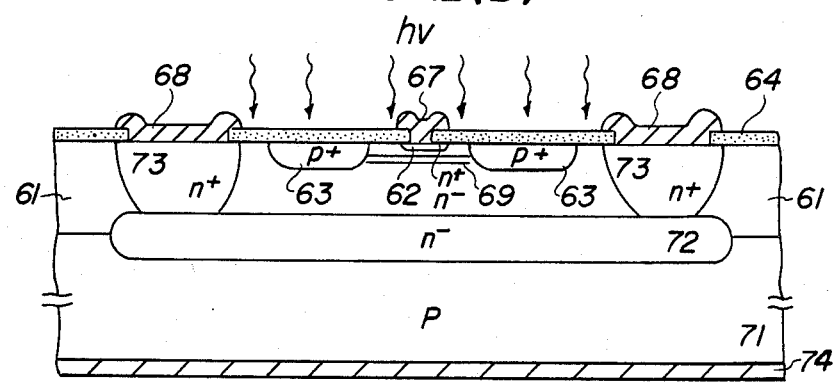

FIG. 12 illustrates another embodiment of the present invention, in which the gate is held floating. FIG. 12(A) shows an example in which the gate is given no metal wiring in the embodiment of FIG. 9(B). FIG. 12(B) shows an example in which the gate is given no metal wiring in the embodiment of FIG. 9(D).

For the semiconductor optoelectro transducers of FIGS. 9 to 12, the static induction thyristor as well as the static induction transistor can be employed.

Figure 13:
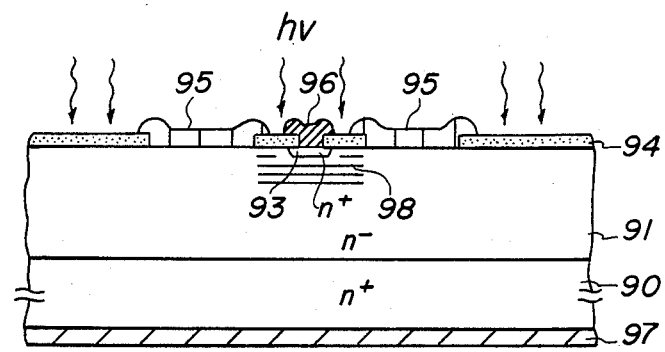
FIG. 13 is a sectional view of an example in which the gate is formed to set up a Schottky barrier.

FIG. 13 illustrates another embodiment of the present invention, in which the gate is formed not by a $p^+$ layer but by a Schottky barrier one. Reference numeral 90 indicates an $n^+$ substrate of silicon, 91 a high resistivity $n^+$ layer (which may also be an intrinsic semiconductor layer), 93 a high impurity density $n^+$ layer to be formed as the source, 94 a surface protective film, 95 a metal which forms a Schottky barrier against silicon, such as platinum or molybdenum, and 96 and 97 metal electrodes of the source and the drain, and 98 one or the whole part of the $n^-$ layer of the channel added with the impurity atoms which are excited by infrared or far infrared light. The Schottky barrier gate can be employed in place of not only the planar gate structure but also the $p^+$ gate in the embodiments described previously in respect of FIGS. 1 to 12.

Figure 14A:
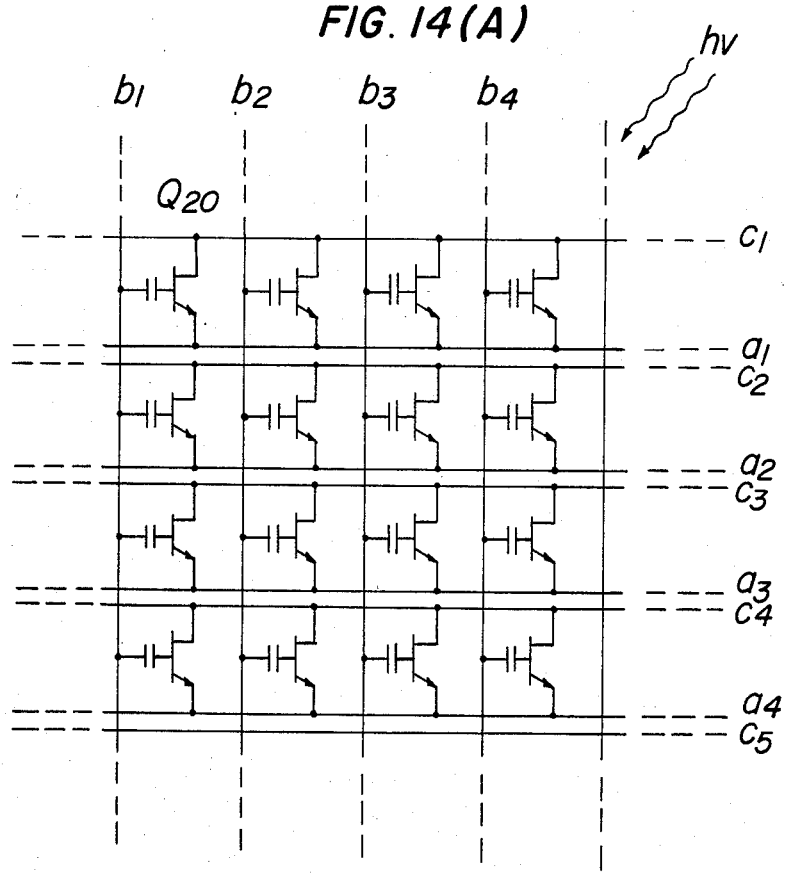
FIGS. 14(A), 14(B) and 15(A), 15(B) are diagrams illustrating embodiments of the semiconductor optoelectro transducers of the present invention of the structures shown in FIGS. 9 and 10.
Figure 14B:
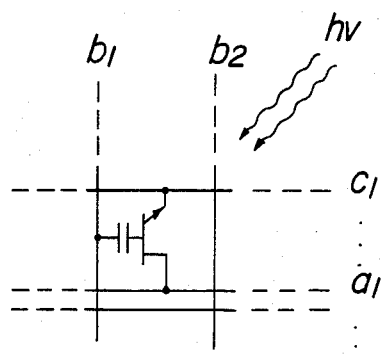

FIG. 14 illustrates another embodiment of the present invention. FIG. 14(A) shows an example of the connection of the optoelectro transducers of the present invention illustrated in FIG. 9. $Q_{20}$ is the semiconductor optoelectro transducer of the present invention in which a capacitor is connected to its gate. The gates, sources and drains of the semiconductor optoelectro transducers arranged in two dimensions are respectively connected to lines $b_1, b_2, \ldots$, lines $a_1, a_2, \ldots$, and lines $c_1, c_2, \ldots$ For instance, in the case of the static induction transistor of FIG. 9(B), since the $n^+$ substrate is used as the drain or source, the drains and sources may be connected to common lines. When the substrate is used as the drain, the source and the gate are wired on the side of the substrate surface. FIG. 14(B) shows an example in which the source and the drain in FIG. 14(A) are reversed in position.

FIGS. 15(A) and 15(B) illustrate other embodiments of the present invention in which a capacitor is connected to the source and in which a capacitor is connected to the drain, respectively. $Q_{21}$ is the semiconductor device of the present invention shown in FIG. 10.

Figure 15:
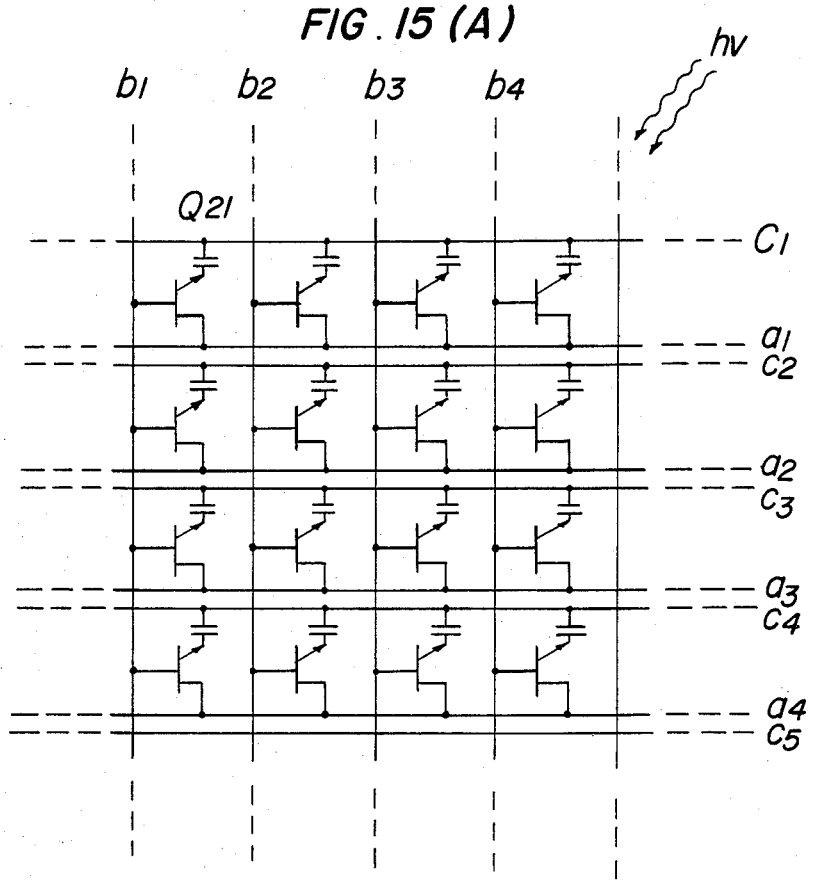
Figure 15:
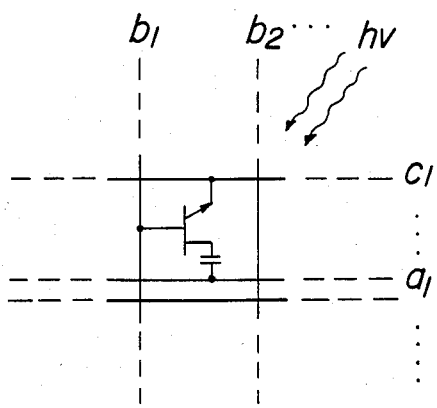

As the semiconductor devices in both of the embodiments of FIGS. 14 and 15, the cells shown in FIGS. 2 to 6 can be used.

The two-dimensional interconnection can be carried out by methods known in conventional random access memory techniques, such as a two-layer interconnection or a metal interconnection using polysilicon for the one electrode and aluminum for the other electrode.

Figure 11:
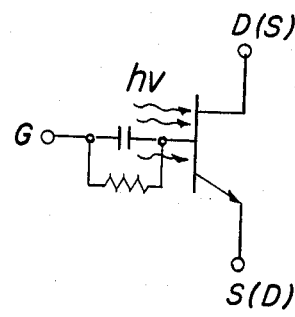
FIGS. 11(A) and 11(B) are circuit diagrams of further embodiments of the invention which utilize a capacitor and a resistor.
FIGS. 11(C) and 11(D) are circuit diagrams sectional views of embodiments of the present invention in which a resistor and a capacitor are connected to the gate.
Figure 11:
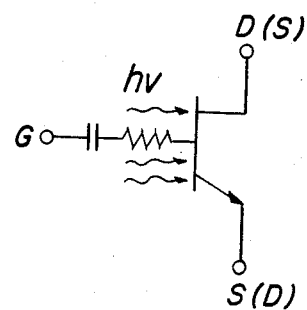
Figure 11:
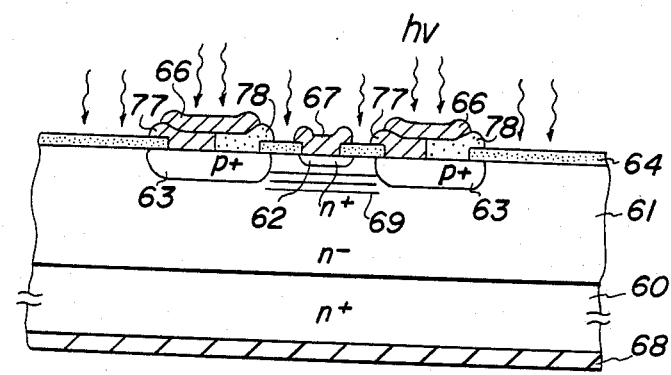
Figure 11:
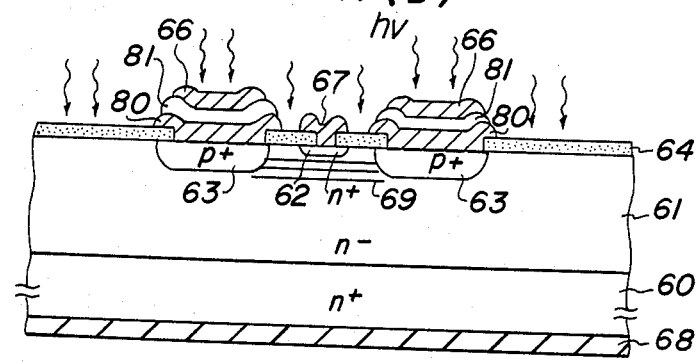

While in FIGS. 14 and 15 are shown the semiconductor optoelectro transducer of the present invention in which a capacitor is connected to the gate, source or drain, it is also possible to combine it with the semiconductor optoelectro transducer of FIG. 11 or any of those in FIGS. 9 to 11 into one cell.

In the embodiments of FIGS. 14 and 15, upon irradiation by the infrared or far infrared light having the energy $h\nu$, photoelectric conversion of infrared or far infrared light is carried out by the cells arranged in two dimensions. Since the cells are each formed by one static induction transistor and high in optical amplification factor, this semiconductor optoelectro transducer possesses the great advantages of high sensitivity to the infrared or far infrared light and simple construction over a photosensor using a diode and a CCD, or a diode and a MOS transistor.

In the embodiments described in the foregoing, when the gate is made floating, the minority carriers created by light irradiation in the channel are stored in the gate region of the reverse conductivity type. If the gate region is held floating, stored charges are erased only through a leak resistor, so that the response speed is lowered.

The stored charges can be positively discharged by connecting a conducting path between the gate region and the source region. In the case where a resistor is connected, the response speed is determined by the capacity of the gate region and the value of the resistor. This resistor can be formed by diffusion or the like in the same semiconductor chip.

When switching means is connected as the conducting path, the response speed is dependent on the interrupted frequency of switching. In this case, charges are stored during the OFF period of the switching means, so that when it is desired to raise the sensitivity in preference to the response speed, it is sufficient to lengthen the OFF period of the switching means. The switching means may also be formed by a transistor or the like in an integrated form on the same semiconductor chip, or formed by a mechanical chopper or the like and off-chipped.

While the foregoing embodiments have been described in connection with the n channel formed by the high resistivity $n^-$ region, it is a matter of course that the channel may be made p-type.

The structure of the light receiving portion is not limited specifically to those used in the foregoing embodiments. For example, the light receiving portion may be formed on the side of the source or drain or at any other places where light can sufficiently be introduced into the active region while in operation.

Such electrode structure as in the foregoing embodiments in which the electrodes are disposed on the side of the light receiving surface is not limited specifically to the illustrated ones, either. The electrodes may be formed in stripe or mesh pattern, or a transparent electrode may also be provided over the entire area of the light receiving surface.

The semiconductor material is not limited specifically to silicon but the III-V compound semiconductor, such as Ge, $Pb_{1-x}Sn_xTe$, $Pb_{1-x}Sn_xS$, $Pb_{1-x}Sn_xSe$, $Hg_{1-x}Cd_xTe$, InSb or GaAs, or their mixed crystal $Ga_xAl_{1-x}As$ or the like can be used.

For the fabrication of the cell, known semiconductor manufacturing methods, such as ion implantation in place of diffusion, CVD for forming an insulating film, plasma etching, anodization, and sputtering, can be employed.

I claim:

1. A semiconductor optoelectric transducer comprising:
   an intrinsic semiconductor material layer of one conductivity type having a channel region which is doped with an element that is excited by infrared light, said element being selected from the group consisting of gold, mercury and zinc; two main electrode regions connected to said semiconductor layer adjacent said channel region for supplying a flow of current through the channel region; a plurality of gate regions communicating with said channel region without closing communication through said channel region between said two main electrode regions; and a portion of said channel region being shaped for receiving infrared light for exciting the element doped into the channel region.

2. A transducer according to claim 1, wherein said plurality of gate regions are distributed in a layer through said channel region, said gate regions each comprising a high impurity layer of opposite conductivity type from said semiconductor layer, portions of said channel region extending through said gate regions layer.

3. A transducer according to claim 1, wherein said plurality of gate regions are formed in an annular high impurity layer of opposite conductivity type from said semiconductor layer.

4. A transducer according to claim 1, wherein said gate regions comprise a pair of gate region high impurity layers having opposite conductivity type from said semiconductor layer and positioned on opposite sides of said channel region.

5. A transducer according to claim 1, wherein said gate regions comprise metal electrodes made of a metal to form a Schottky barrier.

6. A transducer according to claim 1, including a capacitor connected to at least one of said gate regions.

7. A transducer according to claim 6, including a resistor connected in parallel with said capacitor.

8. A transducer according to claim 6, including a resistor connected in series with said capacitor.

9. A transducer according to claim 1, including a capacitor connected to at least one of said main electrode regions.

* * * * *